US010764966B2

(12) United States Patent
Ohkura et al.

(10) Patent No.: US 10,764,966 B2
(45) **Date of Patent: *Sep. 1, 2020**

(54) LAMINATED HEATER WITH DIFFERENT HEATER TRACE MATERIALS

(71) Applicant: LAM RESEARCH CORPORATION, Fremont, CA (US)

(72) Inventors: Yuma Ohkura, San Mateo, CA (US); Darrell Ehrlich, San Jose, CA (US); Eric A. Pape, Campbell, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 564 days.

This patent is subject to a terminal disclaimer.

(21) Appl. No.: 15/586,178

(22) Filed: May 3, 2017

(65) Prior Publication Data

US 2017/0332480 A1 Nov. 16, 2017

Related U.S. Application Data

(60) Provisional application No. 62/334,097, filed on May 10, 2016.

(51) Int. Cl.

| | |
|---|---|
| ***H05B 3/03*** | (2006.01) |
| ***H05B 3/06*** | (2006.01) |
| ***H05B 3/28*** | (2006.01) |
| ***H05K 1/11*** | (2006.01) |
| ***H05K 3/10*** | (2006.01) |
| ***H05B 3/26*** | (2006.01) |

(52) U.S. Cl.
CPC ............... *H05B 3/267* (2013.01); *H05B 3/06* (2013.01); *H05B 2203/016* (2013.01); *H05B 2203/037* (2013.01)

(58) Field of Classification Search
None
See application file for complete search history.

(56) References Cited

U.S. PATENT DOCUMENTS

| | | | | |
|---|---|---|---|---|
| 6,469,283 | B1 * | 10/2002 | Burkhart | H01L 21/67248 219/486 |
| 7,417,206 | B2 | 8/2008 | Nakamura | |
| 8,546,732 | B2 * | 10/2013 | Singh | H01L 21/67109 219/486 |
| 8,637,794 | B2 * | 1/2014 | Singh | C23C 14/541 219/483 |
| 8,884,194 | B2 * | 11/2014 | Singh | C23C 14/541 219/444.1 |

(Continued)

*Primary Examiner* — Joseph M Pelham

(57) ABSTRACT

A substrate support for a substrate processing system includes a plurality of heating zones, a baseplate, at least one of a heating layer and a ceramic layer arranged on the baseplate, and a plurality of heating elements provided within the at least one of the heating layer and the ceramic layer. The plurality of heating elements includes a first material having a first electrical resistance. Wiring is provided through the baseplate in a first zone of the plurality of heating zones. An electrical connection is routed from the wiring in the first zone to a first heating element of the plurality of heating elements. The first heating element is arranged in a second zone of the plurality of heating zones and the electrical connection includes a second material having a second electrical resistance that is less than the first electrical resistance.

14 Claims, 5 Drawing Sheets

(56) References Cited

U.S. PATENT DOCUMENTS

| | | | | |
|---|---|---|---|---|
| 10,049,948 | B2 * | 8/2018 | Gaff | H01L 21/67109 |
| 2006/0096972 | A1 * | 5/2006 | Nakamura | H01L 21/67103 219/444.1 |
| 2010/0116788 | A1 | 5/2010 | Singh et al. | |
| 2011/0092072 | A1 * | 4/2011 | Singh | C23C 14/541 438/710 |
| 2012/0115254 | A1 | 5/2012 | Singh | |
| 2014/0154819 | A1 | 6/2014 | Gaff et al. | |
| 2017/0140958 | A1 * | 5/2017 | Kitagawa | H01L 21/67069 |
| 2017/0229327 | A1 | 8/2017 | Singh et al. | |
| 2019/0159291 | A1 * | 5/2019 | Ptasienski | C23C 16/4586 |

* cited by examiner

LAMINATED HEATER WITH DIFFERENT HEATER TRACE MATERIALS

CROSS-REFERENCE TO RELATED APPLICATIONS

This application claims the benefit of U.S. Provisional Application No. 62/334,097, filed on May 10, 2016 and U.S. Provisional Application No. 62/334,084, filed on May 10, 2016.

The present application is related to U.S. patent application Ser. No. 15/586,203 filed on May 3, 2017. The entire disclosures of the applications referenced above are incorporated herein by reference.

FIELD

The present disclosure relates to substrate processing systems, and more particularly to systems and methods for controlling substrate support temperature.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Example processes that may be performed on a substrate include, but are not limited to, chemical vapor deposition (CVD), atomic layer deposition (ALD), conductor etch, and/or other etch, deposition, or cleaning processes. A substrate maybe arranged on a substrate support, such as a pedestal, an electrostatic chuck (ESC), etc. in a processing chamber of the substrate processing system. During etching, gas mixtures including one or more precursors may be introduced into the processing chamber and plasma may be used to initiate chemical reactions.

A substrate support such as an ESC may include a ceramic layer arranged to support a wafer. For example, the wafer may be clamped to the ceramic layer during processing. A heating layer may be arranged between the ceramic layer and a baseplate of the substrate support. For example only, the heating layer may be a ceramic heating plate including heating elements, wiring, etc. The temperature of the substrate maybe controlled during process steps by controlling the temperature of the heating plate.

SUMMARY

A substrate support for a substrate processing system includes a plurality of heating zones, a baseplate, at least one of a heating layer and a ceramic layer arranged on the baseplate, and a plurality of heating elements provided within the at least one of the heating layer and the ceramic layer. The plurality of heating elements includes a first material having a first electrical resistance. Wiring is provided through the baseplate in a first zone of the plurality of heating zones. An electrical connection is routed from the wiring in the first zone to a first heating element of the plurality of heating elements. The first heating element is arranged in a second zone of the plurality of heating zones and the electrical connection includes a second material having a second electrical resistance that is less than the first electrical resistance.

In other features, a heat output of the electrical connection is less than a heat output of the first heating element for a same voltage input. Each of the plurality of heating elements corresponds to a first electrical trace having the first electrical resistance and the electrical connection corresponds to a second electrical trace having the second electrical resistance. The electrical connection corresponds to a bus trace. A width of the electrical connection is approximately equal to a width of the first heating element. A height of the electrical connection is approximately equal to a height of the first heating element. The second zone is located radially outward of the first zone In other features, the substrate support further includes a via provided through the baseplate and into the at least one of the heating layer and the ceramic layer in the first zone and the wiring is routed through the via. The plurality of heating elements is provided in the ceramic layer and the electrical connection is routed through the ceramic layer. The plurality of heating elements is provided in the heating layer and the electrical connection is routed through the heating layer.

In still other features, the electrical connection and the first heating element are coplanar. The substrate support further includes a conductor layer arranged on the baseplate and the electrical connection is routed through the conductor layer. The conductor layer comprises a polymer and the electrical connection is embedded within the polymer. The first material includes at least one of constantan, a nickel alloy, an iron alloy, and a tungsten alloy and the second material includes at least one of copper, tungsten, silver, and palladium.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
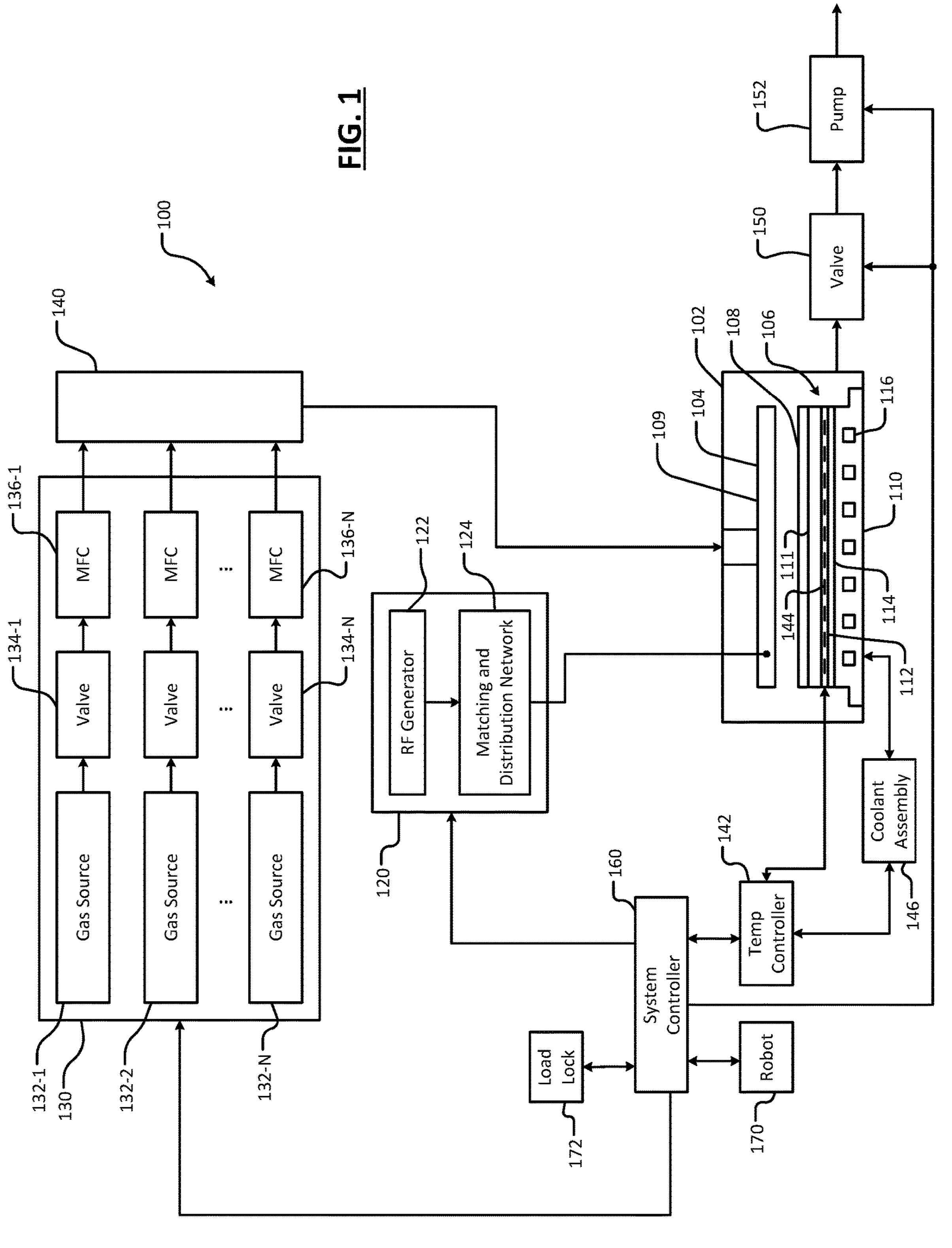
FIG. 1 is a functional block diagram of an example substrate processing system including a substrate support according to the principles of the present disclosure.

A substrate support such as an electrostatic chuck (ESC) may include one or multiple heating zones (e.g., a multi-zone ESC). The ESC may include respective heating elements for each zone of a heating layer. The heating elements are controlled to roughly achieve a desired setpoint temperature in each of the respective zones.

The heating layer may comprise a laminated heating plate arranged between an upper ceramic layer of the substrate support and a baseplate. The heating plate includes a plurality of heating elements arranged throughout the zones of the ESC. The heating elements include electrical traces or other wiring that receive voltage inputs provided from a voltage source below the ESC through the baseplate. For example, the baseplate may include one or more vias (e.g., holes or access ports) aligned with connection points of the heating elements in the heating plate. Wiring is connected between the voltage source and the connection points of the heating elements through the vias in the baseplate.

Typically, it is desirable for the vias and the wiring routed through the vias to be as close as possible to the corresponding connection points of the heating elements to avoid heater exclusion zones (i.e., zones where heating elements cannot be located) and reduce temperature non-uniformities. For example, the vias may be located directly below the connection points. However, in some ESCs, various structural features may interfere with providing vias, wiring, and other heating element components in the most desirable locations. Consequently, the vias and corresponding wiring maybe located further apart, and/or may be located outside of a destination zone of the ESC. For example, in an ESC having a center zone, a mid-inner zone, a mid-outer zone, and an outer zone (e.g., a radially outermost zone of the ESC), vias and wiring for the outer zone maybe located under the mid-outer zone.

Additional wiring maybe required to provide voltage inputs from the vias to the connections points of the various zones of the ESC. In some examples, a conductor layer is arranged under the heating plate for routing the wiring to connection points in the heating plate of the heating layer. The electrical traces/wiring in the conductor layer may be referred to as bus traces/wiring. Conversely, electrical traces/wiring corresponding to the heating layer maybe referred to as heating element wiring/traces. For example, the conductor layer may include wiring embedded within a polymer (e.g., polyimide). However, the electrical traces in the conductor layer may overlap electrical traces in the heating layer, increasing the heat output in the corresponding zone. Accordingly, electrical traces in the conductor layer providing the voltage input to a zone (e.g., to the outer zone) affect the temperature in another zone (e.g., a zone crossed by the electrical trace, such as a mid-outer zone).

In some examples, physical dimensions of the electrical traces in the conductor layer may be modified to minimize the effects of the electrical traces in the conductor layer on the temperature of the corresponding zone. For example, length, width, thickness, etc. of the electrical traces and/or spacing between the electrical traces may be adjusted to minimize resistance and heat output for a given voltage input. However, the ability to minimize heat output in this manner is limited. Further, variance in the physical dimensions of the electrical traces results in interferes with the flatness of the conductor layer and increases heater exclusion areas.

Systems and methods according to the principles of the present disclosure use different materials for the bus traces and the heating element traces and, in some examples, provide the bus traces within the heating layer and eliminate the conductor layer. For example, the heating element traces may comprise a first material while the bus traces comprise a second material having a lower electrical resistance than the first material. Accordingly, the bus traces output less heat than the heating element traces for the same voltage input. In this manner, using different materials for the bus traces and the heating element traces improves design flexibility (e.g., locations of vias), reduces heater exclusion zones, and improves temperature uniformity across the ESC, while maintaining the same physical dimensions for the bus traces and the heating element traces and maintaining flatness.

Referring now to FIG. 1, an example substrate processing system 100 is shown. For example only, the substrate processing system 100 may be used for performing etching using RF plasma and/or other suitable substrate processing. The substrate processing system 100 includes a substrate processing chamber 102 that encloses other components of the substrate processing chamber 102 and contains the RF plasma. The substrate processing chamber 102 includes an upper electrode 104 and a substrate support 106, such as an electrostatic chuck (ESC). During operation, a substrate 108 is arranged on the substrate support 106. While a specific substrate processing system 100 and chamber 102 are shown as an example, the principles of the present disclosure maybe applied to other types of substrate processing systems and chambers, such as a substrate processing system that generates plasma in-situ, that implements remote plasma generation and delivery (e.g., using a microwave tube), etc.

For example only, the upper electrode 104 may include a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

The substrate support 106 includes a conductive baseplate 110 that acts as a lower electrode. The baseplate 110 supports a ceramic layer 111, and a heating plate 112 is arranged between the baseplate 110 and the ceramic layer 111. For example only, the heating plate 112 may correspond to a laminated, multi-zone heating plate. A thermal resistance layer 114 (e.g., a bond layer) may be arranged between the heating plate 112 and the baseplate 110. The baseplate 110 may include one or more coolant channels 116 for flowing coolant through the baseplate 110.

An RF generating system 120 generates and outputs an RF voltage to one of the upper electrode 104 and the lower electrode (e.g., the baseplate 110 of the substrate support 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely. Although, as shown for example purposes, the RF generating system 120 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

A gas delivery system 130 includes one or more gas sources 132-1, 132-2, . . . , and 132-N (collectively gas sources 132), where N is an integer greater than zero. The gas sources supply one or more precursors and mixtures thereof. The gas sources may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may provide voltage inputs to a plurality of heating elements, such as heating elements 144 arranged in the heating plate 112. For example, the heating elements 144 may include, but are not limited to, macro heating elements corresponding to respective zones in a multi-zone heating plate and/or an array of micro heating elements disposed across multiple zones of a multi-zone heating plate. The temperature controller 142 may be used to control the plurality of heating elements 144 to control a temperature of the substrate support 106 and the substrate 108. Although as shown the heating plate 112 is arranged between the ceramic layer 111 and the baseplate 110 (and the bond layer 114), in other examples the heating elements 144 may be provided within the ceramic layer 111 and the heating plate 112 may be omitted. In other examples, the heating elements 144 may be provided in the heating plate 112 and the ceramic layer 111.

The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the substrate support 106.

A valve 150 and pump 152 may be used to evacuate reactants from the processing chamber 102. A system controller 160 may be used to control components of the substrate processing system 100. A robot 170 may be used to deliver substrates onto, and remove substrates from, the substrate support 106. For example, the robot 170 may transfer substrates between the substrate support 106 and a load lock 172. Although shown as separate controllers, the temperature controller 142 may be implemented within the system controller 160.

Figure 2A:
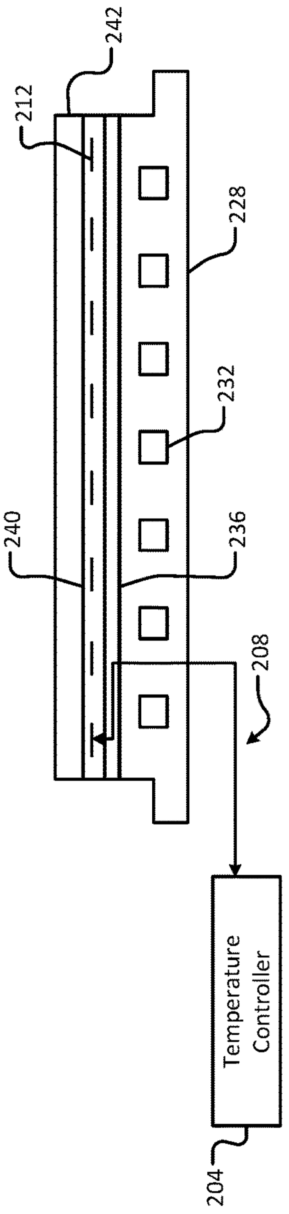
FIG. 2A is an example electrostatic chuck according to the principles of the present disclosure.
Figure 2B:
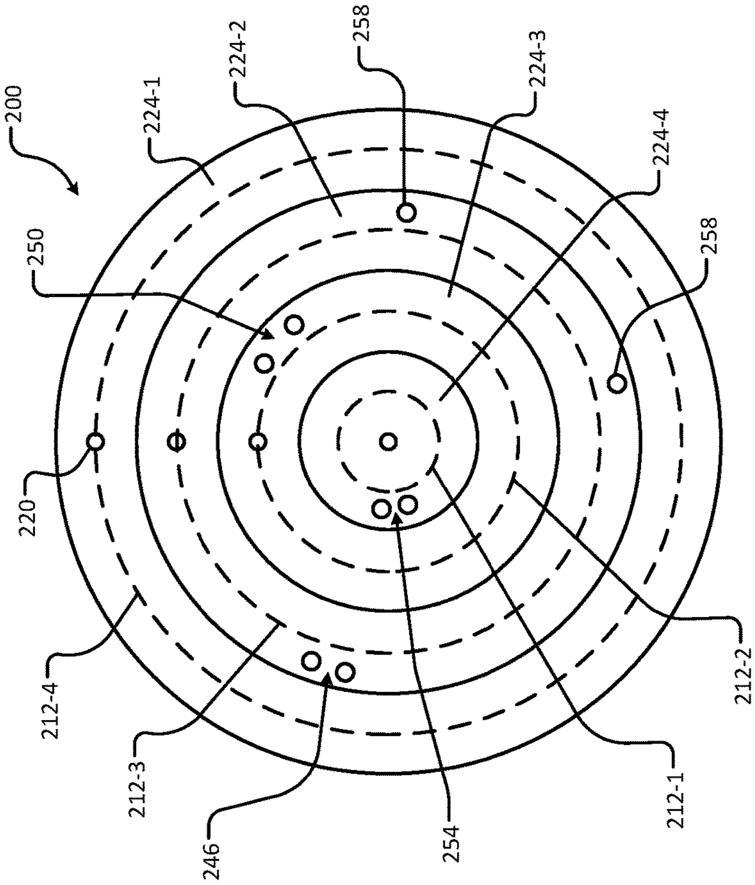
FIG. 2B illustrates zones and thermal control elements of an example electrostatic chuck according to the principles of the present disclosure.

Referring now to FIGS. 2A and 2B, an example ESC 200 is shown. A temperature controller 204 communicates with the ESC 200 via one or more electrical connections 208. For example, the electrical connections 208 may include, but are not limited to, connections for selectively controlling heating elements 212-1, 212-2, 212-3, and 212-4, referred to collectively as heating elements 212, and connections for receiving temperature feedback from one or more zone temperature sensors 220.

As shown, the ESC 200 is a multi-zone ESC including zones 224-1, 224-2, 224-3, and 224-4, referred to collectively as zones 224, which may be referred to as an outer zone, a mid-outer zone, a mid-inner zone, and an inner zone, respectively. Although shown with the four concentric zones 224, in embodiments the ESC 200 may include one, two, three, or more than four of the zones 224. The relative sizes, shapes, orientation, etc. of the zones 224 may vary. For example, the zones 224 may be provides as quadrants or another grid-like arrangement. Each of the zones 224 includes, for example only, a respective one of the zone temperature sensors 220 and a respective one of the heating elements 212. In embodiments, each of the zones 224 may include more than one of the temperature sensors 220.

The ESC 200 includes a baseplate 228 including coolant channels 232, a thermal resistance layer 236 formed on the baseplate 228, a multi-zone ceramic healing plate 240 formed on the thermal resistance layer 236, and an upper ceramic layer 242 formed on the heating plate 240. Voltage inputs are provided from the temperature controller 204 to the heating elements 212 using wiring routed through the baseplate 228 and the ceramic layer 242. In some examples, the heating elements 212 maybe provided within the ceramic layer 242. For example, a dedicated heating plate 240 may be omitted. In FIG. 2A, the electrical connections 208 are shown routed through the thermal resistance layer 236 schematically, for simplicity. In other examples as described below in more detail, the electrical connections 208 may be routed through a dedicated conductor layer, through the heating plate 240, through ceramic layer 242, etc.

The temperature controller 204 controls the heating elements 212 according to a desired setpoint temperature. For example, the temperature controller 204 may receive (e.g., from the system controller 160 as shown in FIG. 1) a setpoint temperature for one or more of the zones 224. For example only, the temperature controller 204 may receive a same setpoint temperature for all or some of the zones 224 and/or different respective setpoint temperatures for each of the zones 224. The setpoint temperatures for each of the zones 224 may vary across different processes and different steps of each process.

The temperature controller 204 controls the heating elements 212 for each of the zones 224 based on the respective setpoint temperatures and temperature feedback provided by the sensors 220. For example, the temperature controller 204 individually adjusts power (e.g., current) provided to each of the heating elements 212 to achieve the setpoint temperatures at each of the sensors 220. The heating elements 212 may each include a single resistive coil or other structure schematically represented by the dashed lines of FIG. 2B. Accordingly, adjusting one of the heating elements 212 affects the temperature of the entire respective zone 224, and may also affect other ones of the zones 224. The sensors 220 may provide temperature feedback for only a local portion of each of the zones 224. For example only, the sensors 220 may be positioned in a portion of each zone 224 previously determined to have the closest correlation to the average temperature of the zone 224.

As shown, respective vias 246, 250, and 254 and corresponding voltage inputs are provided in the mid-outer zone 224-2, the mid-inner zone 224-3, and the inner zone 224-4. As used herein, “vias” generally refers to openings, ports, etc. through a structure such as the baseplate 228, whereas “wiring” refers to conductive material within the vias. Although the vias are shown in pairs in a particular location for example only, any suitable locations and/or number of vias may be implemented. For example, the vias 246, 250, and 254 are provided through a baseplate 228 and wiring is provided through the vias 246, 250, and 254 to respective connections points. However, vias 258 corresponding to the outer zone 224-1 may be located further apart than the vias 246, 250, and 254, and may be located in the mid-outer zone 224-2. In other words, wiring for heating elements of the outer zone 224-1 is not provided directly under the outer zone 224-1. Accordingly, additional electrical connections are required to provide voltage inputs to the heating elements of the outer zone 224-1.

Figures 3A, 3B:
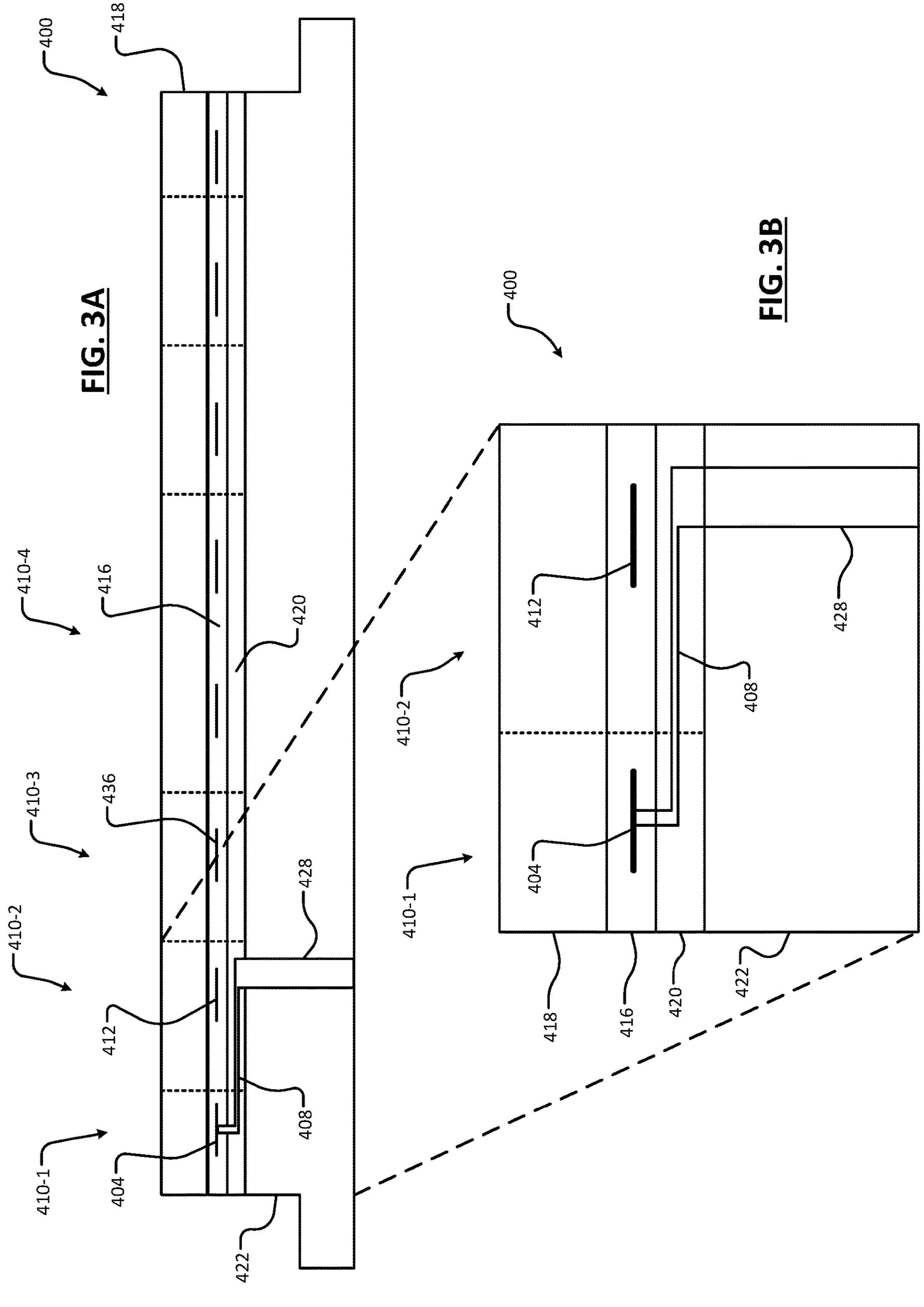
FIGS. 3A and 3B show a first example electrostatic chuck including heating element traces formed from a first material and bus traces formed from a second material according to the principles of the present disclosure.
Figures 4A, 4B:
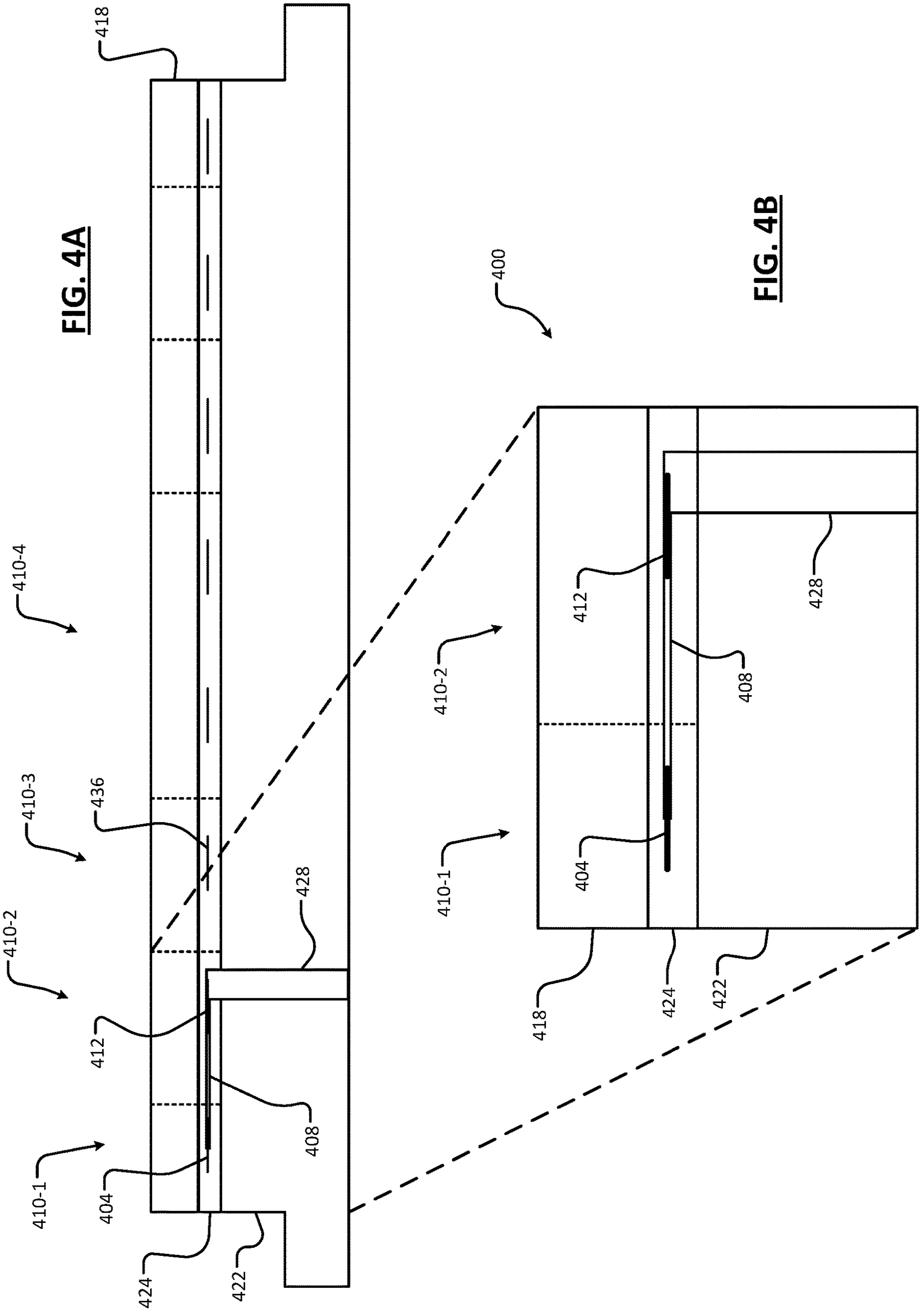
FIGS. 4A and 4B show a second example electrostatic chuck including heating element traces formed from a first material and bus traces formed from a second material according to the principles of the present disclosure.
Figures 5A, 5B:
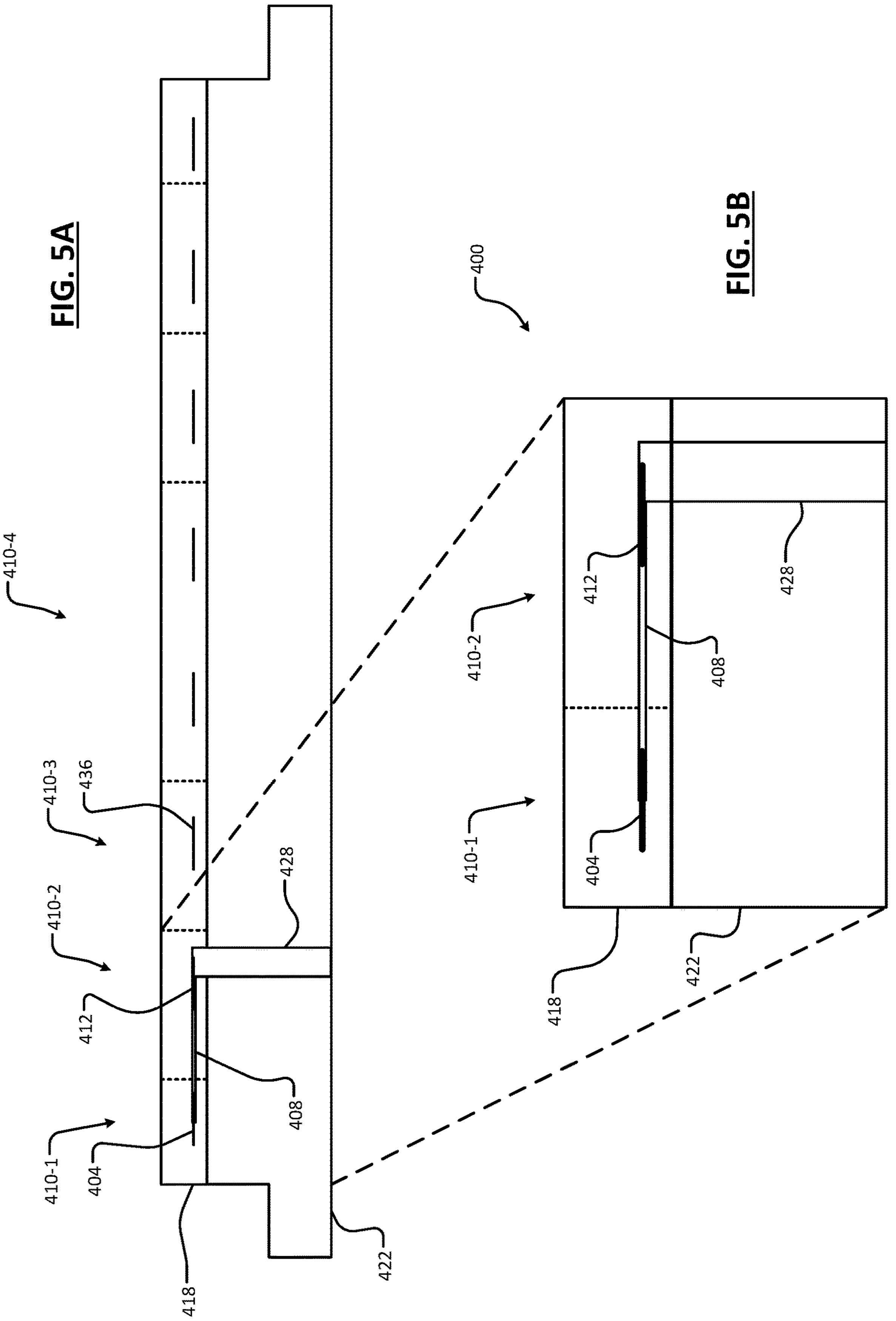
FIGS. 5A and 5B show a third example electrostatic chuck including heating element traces formed from a first material and bus traces formed from a second material according to the principles of the present disclosure.

Referring now to FIGS. 3A, 3B, 4A, 4B, 5A, and 5B, an example ESC 400 including heating element traces 404 formed from a first material and bus traces 408 formed from a second material is shown. FIG. 3B is a close-up view of a portion of the ESC 400 including the heating element traces 404 of FIG. 3A. FIG. 4B is a close-up view of a portion of the ESC 400 including the heating element traces 404 of FIG. 4A. FIG. 5B is a close-up view of a portion of the ESC 400 including the heating element traces 404 of FIG. 5A. The ESC 400 has a plurality of zones including, for example only, an outer zone 410-1, a mid-outer zone 410-2, a mid-inner zone 410-3, and an inner zone 410-4, which maybe referred to collectively as zones 410.

The second material has a lower electrical resistance than the first material. Accordingly, the bus traces 408 output less heat than the heating element traces 404. In this manner, the bus traces 408 provide a voltage input to the heating element traces 404 without significantly increasing the temperature in areas of the ESC 400 where the bus traces 408 overlap the heating element traces 404. For example, the bus traces 408 may cross the mid-outer zone 410-2 of the ESC 400 to provide the voltage input to the heating element traces 404 in the outer zone 410-1 of the ESC 400. However, due to the lower electrical resistance of the bus traces 408 relative to the heating element traces 404, the bus traces 408 do not significantly affect the temperature in areas where heating element traces 412 of the mid-outer zone 410-2 overlap the bus traces 408, or in areas where the heating element traces 404 of the outer zone 410-1 overlap the bus traces 408. Accordingly, a width and/or height of the bus traces 408 may be approximately equal to a width and/or height of the heating element traces 404 without increasing a heat output overlapping regions of the bus traces 408 and the heating element traces 404. For example, the width and/or height of the bus traces 408 is within 10% of the width and/or height of the heating element traces 404. In another example, the width and/or height of the bus traces 408 is within 5% of the width and/or height of the heating element traces 404.

As shown in FIGS. 3A and 3B, the ESC 400 includes a heating layer 416 including the heating element traces 404, a ceramic layer 418, and a separate conductor layer 420 including the bus traces 408. The heating layer 416, the ceramic layer 418, and the conductor layer 420 are formed on a baseplate 422. For simplicity, a bond layer (e.g., corresponding to the bond layer 114) is not shown in FIGS. 3A, 3B, 4A, 4B, 5A and 5B. Conversely, in FIGS. 4A and 4B, the ESC 400 includes a combined heating/conductor layer 424 that includes both the heating element traces 404 and the bus traces 408. In other words, the heating element traces 404 and the bus traces 408 are coplanar. Accordingly, the ESC 400 shown in FIG. 3B eliminates the conductor layer 420 and requires only a single layer 424. In some examples having only the single layer 424, a single conductor sheet comprising the heating element traces 404 of a first material and the bus traces 408 of the second material may be provided. For example only, the first material may include a material having a relatively high electrical resistance (e.g., constantan, nickel alloy, iron alloy, tungsten alloy etc.) while the second material may include a material having a relatively low electrical resistance (e.g., copper, tungsten, silver, palladium, alloys thereof, etc.). In FIGS. 5A and 5B, the ESC 400 does not include a dedicated heating layer 416. Instead, in this example, the heating element traces 404, 412, etc. are provided in the ceramic layer 418. Accordingly, the bus traces 408 are routed through the ceramic layer 418.

For example purposes, the bus traces 408 are only shown routed from a via 428 in the mid-outer zone 410-2 to the outer zone 410-1. However, in other examples, the respective ones of the vias 428 and the bus traces 408 maybe provided in anyone or more of the zones 410. In some examples, the bus traces 408 are routed across multiple ones of the zones 410 (e.g., from a via located in the mid-inner zone 410-3 to the outer zone 410-1). Further, although as shown the bus traces 408 are routed from a via in a radially inward zone to a radially outward zone, in other examples the bus traces 408 are routed from a via in a radially outward zone to a radially inward zone (e.g., from a via located in the outer zone 410-1 to the mid-inner zone 410-3).

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method maybe executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller maybe defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller maybe in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters maybe specific to the type of process to be performed and the type of tool that the controller is configured to interface with or control. Thus as described above, the controller maybe distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate support for a substrate processing system, the substrate support comprising:

a plurality of annular heating zones;

a baseplate;

at least one of a heating layer and a ceramic layer arranged on the baseplate;

a plurality of heating elements provided within the at least one of the heating layer and the ceramic layer, wherein the plurality of heating elements comprises a first material having a first electrical resistance;

wiring provided through the baseplate in a first zone of the plurality of heating zones; and an electrical connection routed from the wiring in the first zone to a first heating element of the plurality of heating elements, wherein the first heating element is arranged in a second zone of the plurality of heating zones, wherein the electrical connection crosses from the first zone to the second zone to connect to the first heating element arranged in the second zone and does not connect to any heating elements arranged in the first zone, and wherein the electrical connection comprises a second material having a second electrical resistance that is less than the first electrical resistance.

2. The substrate support of claim 1, wherein a heat output of the electrical connection is less than a heat output of the first heating element for a same voltage input.

3. The substrate support of claim 1, wherein (i) each of the plurality of heating elements corresponds to a first electrical trace having the first electrical resistance and (ii) the electrical connection corresponds to a second electrical trace having the second electrical resistance.

4. The substrate support of claim 1, wherein the electrical connection corresponds to a bus trace.

5. The substrate support of claim 1, wherein a width of the electrical connection is approximately equal to a width of the first heating element.

6. The substrate support of claim 1, wherein a height of the electrical connection is approximately equal to a height of the first heating element.

7. The substrate support of claim 1, wherein the second zone is located radially outward of the first zone.

8. The substrate support of claim 1, further comprising a via provided through the baseplate and into the at least one of the heating layer and the ceramic layer in the first zone, wherein the wiring is routed through the via.

9. The substrate support of claim 1, wherein the plurality of heating elements is provided in the ceramic layer and the electrical connection is routed through the ceramic layer.

10. The substrate support of claim 1, wherein the plurality of heating elements is provided in the heating layer and the electrical connection is routed through the heating layer.

11. The substrate support of claim 1, wherein the electrical connection and the first heating element are coplanar.

12. The substrate support of claim 1, further comprising a conductor layer arranged on the baseplate, wherein the electrical connection is routed through the conductor layer.

13. The substrate support of claim 12, wherein the conductor layer comprises a polymer and the electrical connection is embedded within the polymer.

14. The substrate support of claim 1, wherein the first material comprises at least one of constantan, a nickel alloy, an iron alloy, and a tungsten alloy and the second material comprises at least one of copper, tungsten, silver, and palladium.

* * * * *